US012565907B2

(12) United States Patent
Kawaguchi et al.

(10) Patent No.: US 12,565,907 B2
(45) Date of Patent: Mar. 3, 2026

(54) FIXING MECHANISM AND ELECTRICAL JUNCTION BOX

(71) Applicant: Sumitomo Wiring Systems, Ltd., Yokkaichi (JP)

(72) Inventors: Kiyofumi Kawaguchi, Yokkaichi (JP); Takumi Ejima, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 18/700,006

(22) PCT Filed: Sep. 27, 2022

(86) PCT No.: PCT/JP2022/035815
§ 371 (c)(1),
(2) Date: Apr. 10, 2024

(87) PCT Pub. No.: WO2023/063069
PCT Pub. Date: Apr. 20, 2023

(65) Prior Publication Data
US 2024/0337283 A1      Oct. 10, 2024

(30) Foreign Application Priority Data

Oct. 12, 2021     (JP) ................................. 2021-167462

(51) Int. Cl.
*H05K 5/00*      (2025.01)
*F16B 37/04*      (2006.01)
*H02G 3/08*      (2006.01)

(52) U.S. Cl.
CPC ............. *F16B 37/043* (2013.01); *H02G 3/08* (2013.01); *H05K 5/0043* (2013.01)

(58) Field of Classification Search
CPC .................................................. H05K 5/0043
See application file for complete search history.

(56) References Cited

U.S. PATENT DOCUMENTS 6,357,811 B1     3/2002  Nakamura et al.
2021/0084781 A1*  3/2021  Cams ................. G02B 6/44465

FOREIGN PATENT DOCUMENTS

| JP | H6-006728 | 1/1994 |
| JP | H6-028323 | 4/1994 |
| JP | 2017-200276 A | 11/2017 |

OTHER PUBLICATIONS

International Search Report, Application No. PCT/JP2022/035815, mailed Nov. 1, 2022. ISA/Japan Patent Office.

* cited by examiner

*Primary Examiner* — Hung V Ngo
(74) *Attorney, Agent, or Firm* — Honigman LLP

(57) ABSTRACT

A mount provided with a nut includes at least one pair of pinchers that pinch the nut, in which the paired pinchers are disposed to oppose each other and are deformable in an opposing direction thereof.

12 Claims, 7 Drawing Sheets

FIXING MECHANISM AND ELECTRICAL JUNCTION BOX

CROSS-REFERENCE TO RELATED APPLICATIONS

This application is the U.S. national stage of PCT/JP2022/035815 filed on Sep. 27, 2022, which claims priority of Japanese Patent Application No. JP 2021-167462 filed on Oct. 12, 2021, the contents of which are incorporated herein.

TECHNICAL FIELD

The present disclosure relates to a fixing mechanism and an electrical junction box that includes the fixing mechanism.

BACKGROUND

Conventionally, various ideas have been devised regarding fixing mechanisms for fastening components with screws.

JP 2017-200276A discloses an electrical junction box in which, when fastening a fuse with a screw inserted through a through-hole provided in a terminal unit of the fuse, a bus bar is interposed between the terminal unit and the head of the screw, in order to prevent the rotating force that turns the screw from being transmitted directly to the terminal unit of the fuse that contacts the head of the screw and the terminal unit being deformed.

Screw-fastening with screws and nuts is widely used as one type of fixing mechanism, and in screw-fastening, a screw is passed through a through-hole formed in a fixture of a component to be fixed to an object and screwed into a threaded hole of a nut provided in the object.

However, the dimensions of the fixture may deviate significantly from expected values due to design errors or tolerances. In this case, a large misalignment also occurs between the through-hole of the fixture and the threaded hole of the nut, making proper screw-fastening impossible.

Therefore, an object is to provide a fixing mechanism and an electrical junction box capable of proper screw-fastening even if a large misalignment occurs between a through-hole of a fixture of a component and a threaded hole of a nut.

SUMMARY

A fixing mechanism according to an embodiment of the present disclosure is a fixing mechanism provided with a nut, the fixing mechanism including at least one pair of pinchers configured to pinch the nut, in which the pinchers of the pair of pinchers are disposed to oppose each other and are deformable in a direction opposing each other.

An electric junction box according to an embodiment of the present disclosure includes an enclosure, the above-described fixing mechanism, and an electronic component fixed to the enclosure by the fixing mechanism.

Advantageous Effects

According to the present disclosure, proper screw-fastening is possible even if a large misalignment occurs between a through-hole of a fixture of a component and a threaded hole of a nut.

BRIEF DESCRIPTION OF DRAWINGS

FIG. 7AB shows a cross-sectional view of FIG. 5 taken along line VIIB-VIIB.

DETAILED DESCRIPTION OF PREFERRED EMBODIMENTS

Figure 1:
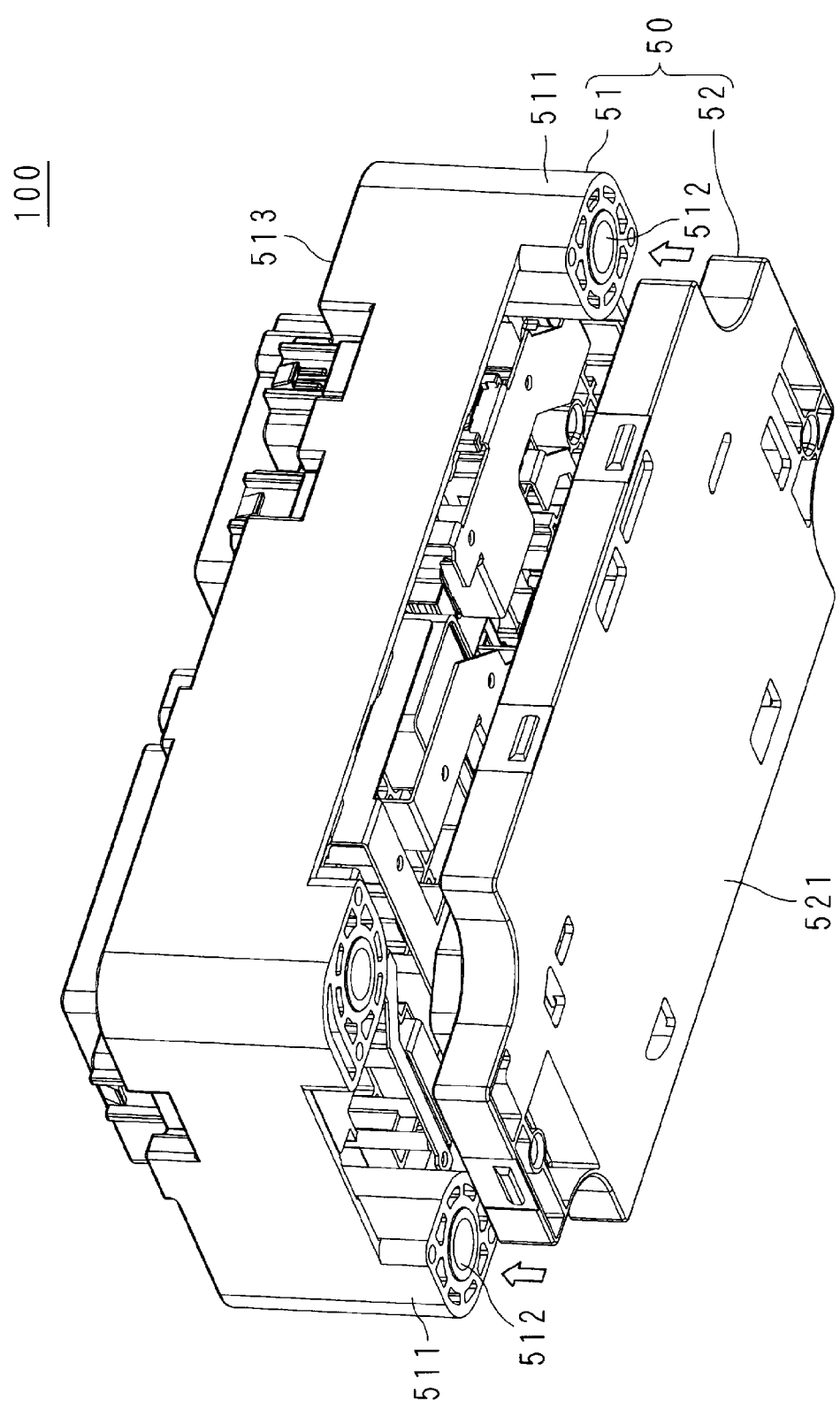
FIG. 1 is a partially exploded view of an electrical junction box according to the present embodiment.

First, embodiments of the present disclosure will be listed and described. Furthermore, at least some of the embodiments described below may be combined as appropriate.

A fixing mechanism according to an embodiment of the present disclosure is a fixing mechanism provided with a nut, the fixing mechanism including at least one pair of pinchers configured to pinch the nut, in which the paired pinchers are disposed to oppose each other and are deformable in an opposing direction thereof.

In the present embodiment, the nut is pinched by at least one pair of pinchers, and the paired pinchers are deformable in the direction in which the pinchers oppose each other. Therefore, if misalignment occurs between a through-hole of a fixture of a component to be screw-fastened to the nut and a threaded hole of the nut due to design errors or tolerances of the component, the through-hole of the fixture of the component and the threaded hole of the nut can be aligned by deforming the pinchers.

The fixing mechanism according to an embodiment of the present disclosure includes a housing recess configured to housing the nut, in which a dimension of the housing recess in a radial direction of a through-hole of the nut is greater than the nut, and the pair of pinchers are provided further inward than an inner surface of the housing recess.

In the present embodiment, because the dimension of the housing recess in the radial direction of the threaded hole (through-hole) of the nut is greater than the nut, the nut is movable in the radial direction of the threaded hole with the nut housed in the housing recess, that is, with the nut pinched by the pair of pinchers. Therefore, if misalignment occurs as described above due to design errors or tolerances of the component to be screw-fastened to the nut, the through-hole of the fixture of the component and the threaded hole of the nut can be aligned by moving the nut.

The fixing mechanism according to an embodiment of the present disclosure includes two pairs of pinchers, with the opposing directions of the paired pinchers of the two pairs intersecting each other, each pincher includes an elastic deformation portion that extends in a thickness direction of the nut, and at least one pair of pinchers includes, at a distal end of the elastic deformation portion, a protrusion that protrudes towards the nut.

In the present embodiment, because one nut is pinched by two pairs of pinchers, with the opposing directions of the paired pinchers of the two pairs intersecting each other, the nut is movable in the two intersecting directions. Moreover, at least one pair of pinchers includes the protrusions at the distal end, and the nut can be prevented from coming out of the housing recess by the protrusions.

In the fixing mechanism according to an embodiment of the present disclosure, the nut is housed in the housing recess with one surface thereof exposed, and an engaging portion configured to engage the protrusions is formed on the one surface.

In the present embodiment, the engaging portion is formed on the one surface of the nut, and the engaging portion engages the protrusions of the pinchers. Therefore, the nut is reliably prevented from coming out of the housing recess.

In the fixing mechanism according to an embodiment of the present disclosure, the nut is rectangular, and two opposing edge portions of the nut are pinched by one pair of pinchers.

In the present embodiment, for example, the nut is rectangular, and the two opposing edge portions of the nut are respectively pinched by one pair of pinchers. Therefore, the nut is suitably pinched.

In the fixing mechanism according to an embodiment of the present disclosure, a cutout is formed in a sidewall of the housing recess at a location that corresponds to each pincher.

In the present embodiment, a cutout is formed in a sidewall of the housing recess at a location that corresponds to each pincher. Therefore, the sidewall of the housing recess does not interfere when the paired pinchers deform, and the degree of freedom of deformation increases.

An electrical junction box according to an embodiment of the present disclosure includes an enclosure, any of the above-described fixing mechanisms, and an electronic component fixed to the enclosure by the fixing mechanism.

In the present embodiment, the electronic component is screw-fastened to the fixing mechanism at the time of being fixed to the enclosure. As described above, the position of the nut is movable in the fixing mechanism. Therefore, if misalignment occurs as described above due to design errors or tolerances of the electronic component to be screw-fastened to the nut, the through-hole of the fixture of the electronic component and the threaded hole of the nut can be aligned by moving the nut.

A fixing mechanism and an electrical junction box according to embodiments of the present disclosure will be described hereinafter with reference to the drawings. The present disclosure is not limited by these examples and is indicated by the claims, and all changes that come within the meaning and range of equivalency of the claims are intended to be encompassed therein.

The present embodiment will be described hereinafter using the example of an electrical junction box for a vehicle in which electronic components, such as a fuse, are mounted.

FIG. 1 is a partially exploded view of an electrical junction box 100 according to the present embodiment. The electrical junction box 100 includes an enclosure 50 to which electronic components are attached.

The enclosure 50 is made, for example, of resin and includes a lower case 52 and an upper case 51 that covers the lower case 52. The enclosure 50 is attached to an object such that a bottom plate 521 of the lower case 52 faces the object. More specifically, the upper case 51 has closed-end cylindrical leg portions 511 provided at four corners thereof, and each leg portion 511 has a fixing through-hole 512 formed in the bottom thereof. For example, the enclosure 50 (electrical junction box 100) can be attached to the object by inserting screws into the fixing through-holes 512 of the leg portions 511 and screwing the screws into the object.

The upper case 51 has the shape of a flat enclosure having one face open, and ribs are formed at a plurality of locations in the upper case 51, and a plurality of mounts are also formed therein. Busbars, electronic components, and the like are attached to the above-described mounts.

Figure 2:
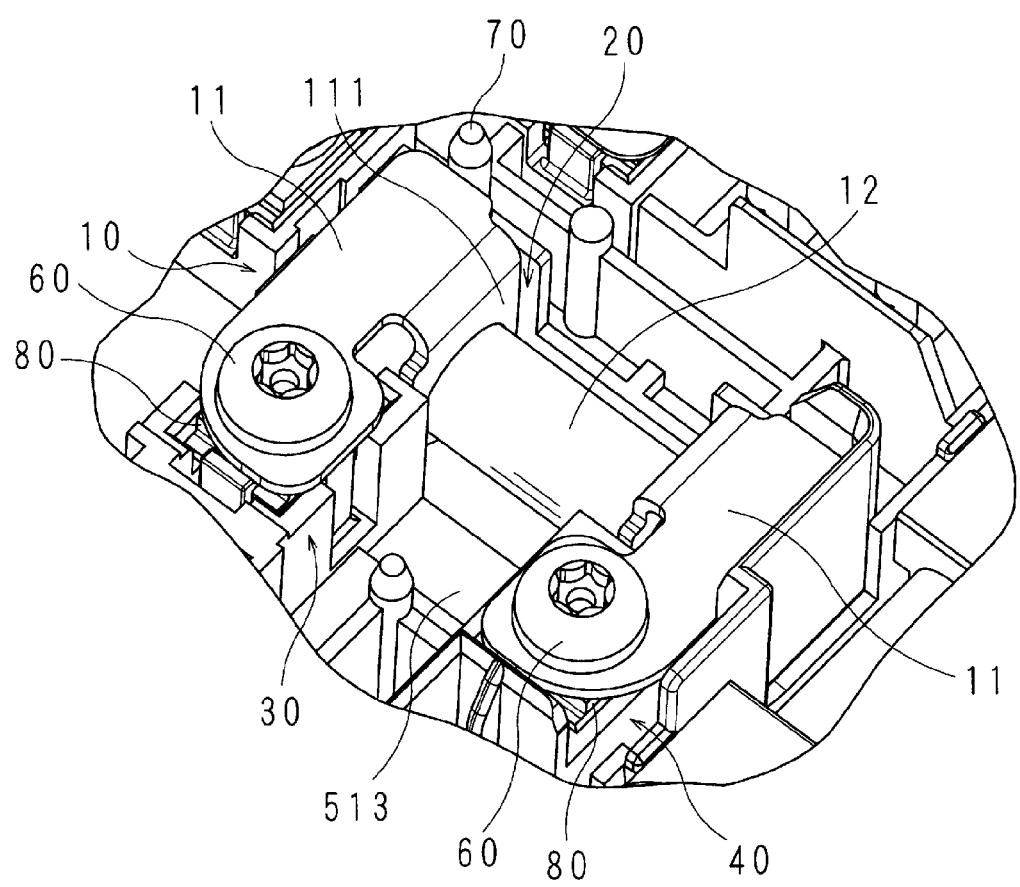
FIG. 2 is an exemplary view illustrating an upper case of the electronic junction box of the present embodiment with an electronic component attached thereto.

FIG. 2 is an exemplary view illustrating an upper case 51 of the electrical junction box 100 of the present embodiment with an electronic component attached thereto. FIG. 2 is a partial bottom view of the upper case 51, and shows a fuse unit 10 (electronic component) attached thereto.

Formed in the inner surface (referred to as the bottom hereinafter) of a ceiling plate 513 of the upper case 51 is a recess 20 that houses a part of the fuse unit 10, with mounts 30 and 40 protruding adjacent to the recess 20 to fix the fuse unit 10. The fuse unit 10 prevents overcurrent flow.

The fuse unit 10 includes a cylindrical fuse 12. The fuse 12 is made, for example, of glass or ceramic and has a fuse element (not shown) disposed therein. A cap (not shown) made of a conductive metal is attached in both end sides of the fuse 12.

Additionally the fuse unit 10 includes a pair of fixing legs 11 screw-fastened to the mounts 30 and 40. The paired fixing legs 11 are parallel to each other. Each fixing leg 11 is formed from a metal piece in an approximately rectangular shape with round corners. For example, the fixing legs 11 are made of the same material as the above-described caps. Formed in one end of each fixing leg 11 is a screw through-hole (not shown) that passes through the fixing leg 11 in the thickness direction thereof.

Each fixing leg 11 is coupled to the respective cap via a coupling plate 111. The coupling plate 111 is formed from a metal piece made of the same material as the fixing leg 11. One end of the coupling plate 111 is connected to a long side of the fixing leg 11 near the other end of the fixing leg 11 and extends in the thickness direction of the fixing leg 11. Also, the other end of the coupling plate 111 is coupled to an outer peripheral surface of the above-described cap.

For example, the fixing leg 11 and the coupling plate 111 may be integrally formed, or the fixing leg 11, the coupling plate 111, and the above-described cap may be integrally formed.

Figure 3:
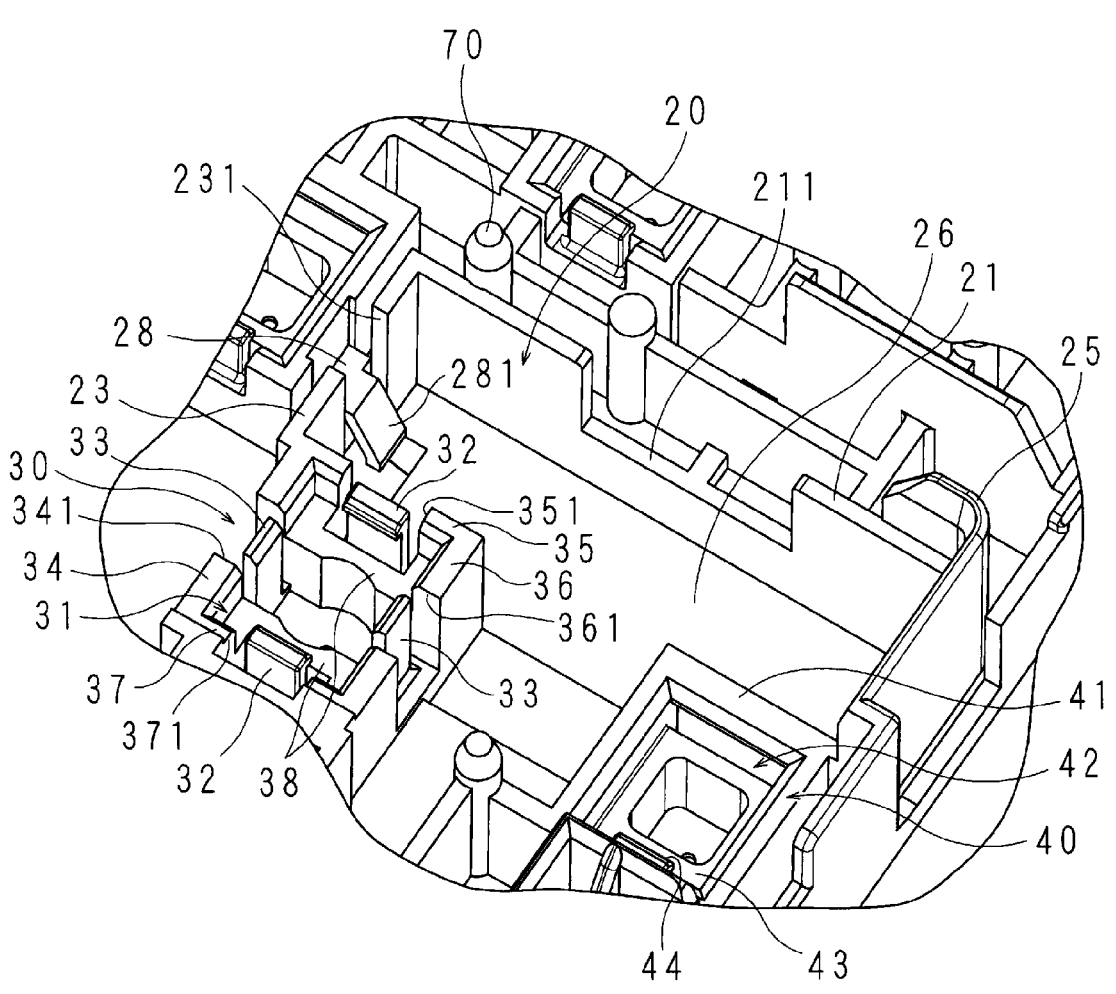
FIG. 3 is a partial perspective view showing the upper case with a fuse unit and screws removed.
Figure 4:
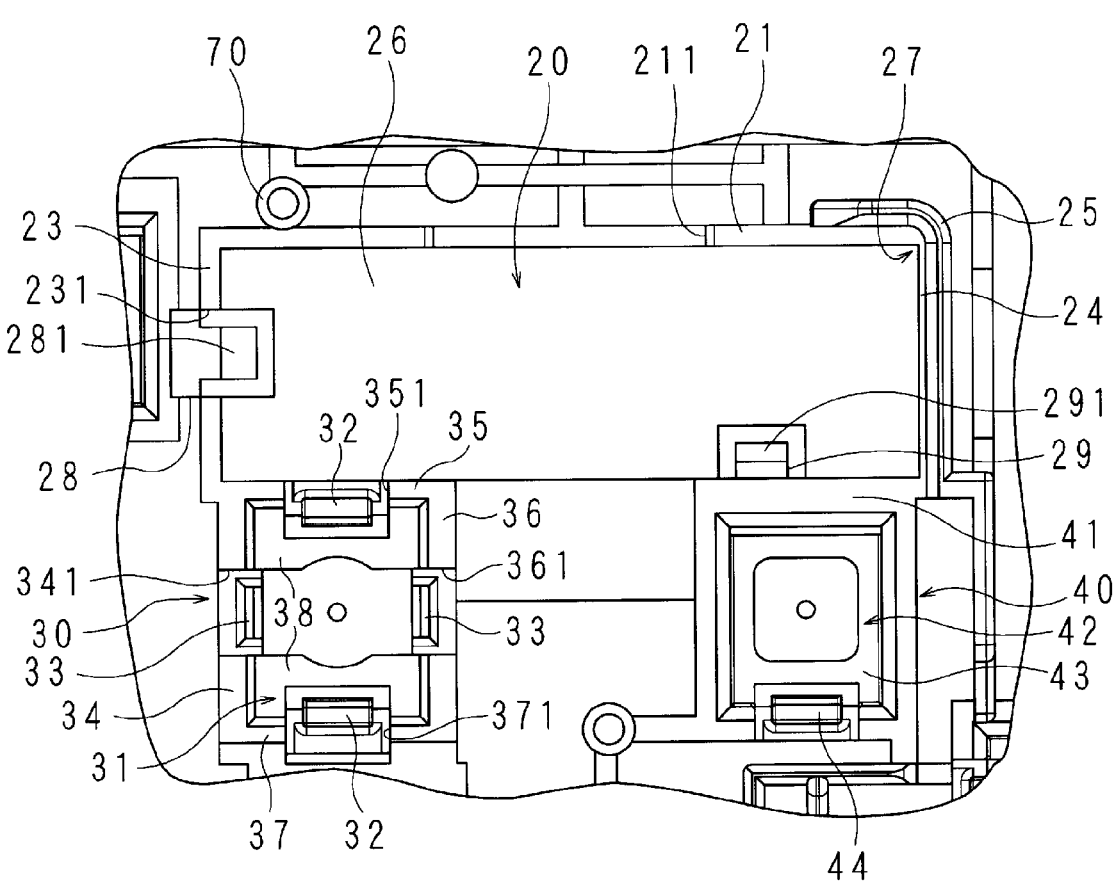
FIG. 4 is a partial bottom view showing the upper case with the fuse unit, the screws, and nuts removed.

FIG. 3 is a partial perspective view of the upper case 51 showing the fuse unit 10, screws 60, and nuts 80 removed, and FIG. 4 is a partial bottom view of the upper case 51 showing the fuse unit 10, the screws 60, and the nuts 80 removed. As mentioned above, a recess 20 is formed in the bottom of the upper case 51 in which the fuse unit 10 is partially housed.

The recess 20 has an approximately rectangular shape as seen from the bottom with one of the long sides thereof open, and the mounts 30 and 40 protrude from locations corresponding to the above-described long side of the recess 20 and are spaced apart with a predetermined interval therebetween. That is, the recess 20 is formed by being surrounded with a long-side sidewall 21 on the other long side, short-side sidewalls 23 and 24 on both short sides, a sidewall 35 of the mount 30 and a sidewall 41 of the mount 40. The long-side sidewall 21 and the short-side sidewalls 23 and 24 stand erect on the bottom of the upper case 51. With the fuse unit 10 attached to the upper case 51, a part of the fuse unit 10, except for the fixing legs 11 thereof, is housed in the recess 20. A cutout 211 is formed at the longitudinal center of the long-side sidewall 21.

A positioning portion 25 is provided in the recess 20 at a corner 27 formed by the long-side sidewall 21 and the short-side sidewall 24. The positioning portion 25 positions the fuse unit 10 when the fuse unit 10 is attached to the upper case 51.

The positioning portion 25 is curved to extend from the short-side sidewall 24 to the end portion of the long-side sidewall 21 on the short-side sidewall 24 side. Additionally, the positioning portion 25 protrudes, in the height direction of the long-side sidewall 21 and the short-side sidewall 24, further than the edges of the long-side sidewall 21 and the short-side sidewall 24. The positioning portion 25 may be integrally formed with the long-side sidewall 21 and the short-side sidewall 24.

The recess 20 includes a first spring portion 28 and a second spring portion 29 that press the above-described part of the fuse unit 10 towards the positioning portion 25 when the fuse unit 10 is housed in the recess 20. The first spring portion 28 and the second spring portion 29 may also be abbreviated to spring portions 28 and 29 hereinafter.

The spring portions 28 and 29 are provided inside the recess 20. The first spring portion 28 presses the above-described part of the fuse unit 10 towards the short-side sidewall 24, and the second spring portion 29 presses the above-described part of the fuse unit 10 towards the long-side sidewall 21.

The first spring portion 28 is made of resin and is provided on the short-side sidewall 23 opposing the short-side sidewall 24 on which the positioning portion 25 is provided. A cutout 231 is formed in the center of the short-side sidewall 23 to extend in the height direction of the short-side sidewall 23, and the first spring portion 28 is provided in the cutout 231.

The first spring portion 28 includes an elastic plate 281 that protrudes further inward of the recess 20 than the short-side sidewall 23. The elastic plate 281 is rectangular and is provided to be further away from the short-side sidewall 23 as the elastic plate 281 approaches the bottom of the recess 20. That is, the interval between the short-side sidewall 23 and the elastic plate 281 becomes larger as the elastic plate 281 approaches the bottom of the recess 20. The elastic plate 281 has elasticity and is thus elastically deformable in directions in which the above-described interval increases and decreases.

The second spring portion 29 is made of resin and, as shown in FIG. 4, is provided on a sidewall 41 of the mount 40 opposing the long-side sidewall 21 on which the positioning portion 25 is provided. That is, the second spring portion 29 is provided to approximately oppose the portion of the positioning portion 25 that is provided on the long-side sidewall 21. The second spring portion 29 includes an elastic plate 291 that protrudes inward of the recess 20. Since the shape of the elastic plate 291 is similar to the elastic plate 281, detailed description thereof is omitted. The elastic plate 291 has elasticity and is thus elastically deformable in directions in which the above-described interval to the sidewall 41 increases and decreases.

A rotation prevention bar 70 protrudes on the outside of the long-side sidewall 21 of the recess 20. The rotation prevention bar 70 prevents the fuse unit 10 from rotating when the fuse unit 10 is attached to the upper case 51 (mounts 30, 40) by screw-fastening.

The rotation prevention bar 70 has the shape of a round bar with a reduced diameter at the distal end thereof. The rotation prevention bar 70 is provided near the end portion of the long-side sidewall 21 close to the short-side sidewall 23. The peripheral surface of the rotation prevention bar 70 is in contact with the outer surface of the long-side sidewall 21. The rotation prevention bar 70 has a greater height than the long-side sidewall 21. The rotation prevention bar 70 prevents rotation of the fuse unit 10 by coming into contact with a fixing leg 11 when the fuse unit 10 is attached (see FIG. 2). It should be noted that the rotation prevention bar 70 may be integrally formed with the long-side sidewall 21.

The fuse unit 10 can be screw-fastened to the upper case 51 by inserting screws 60 into the above-described screw through-holes in the fixing legs 11 and screwing the screws 60 into the nuts 80 of the mounts 30 and 40, respectively (see FIG. 2).

Figure 5:
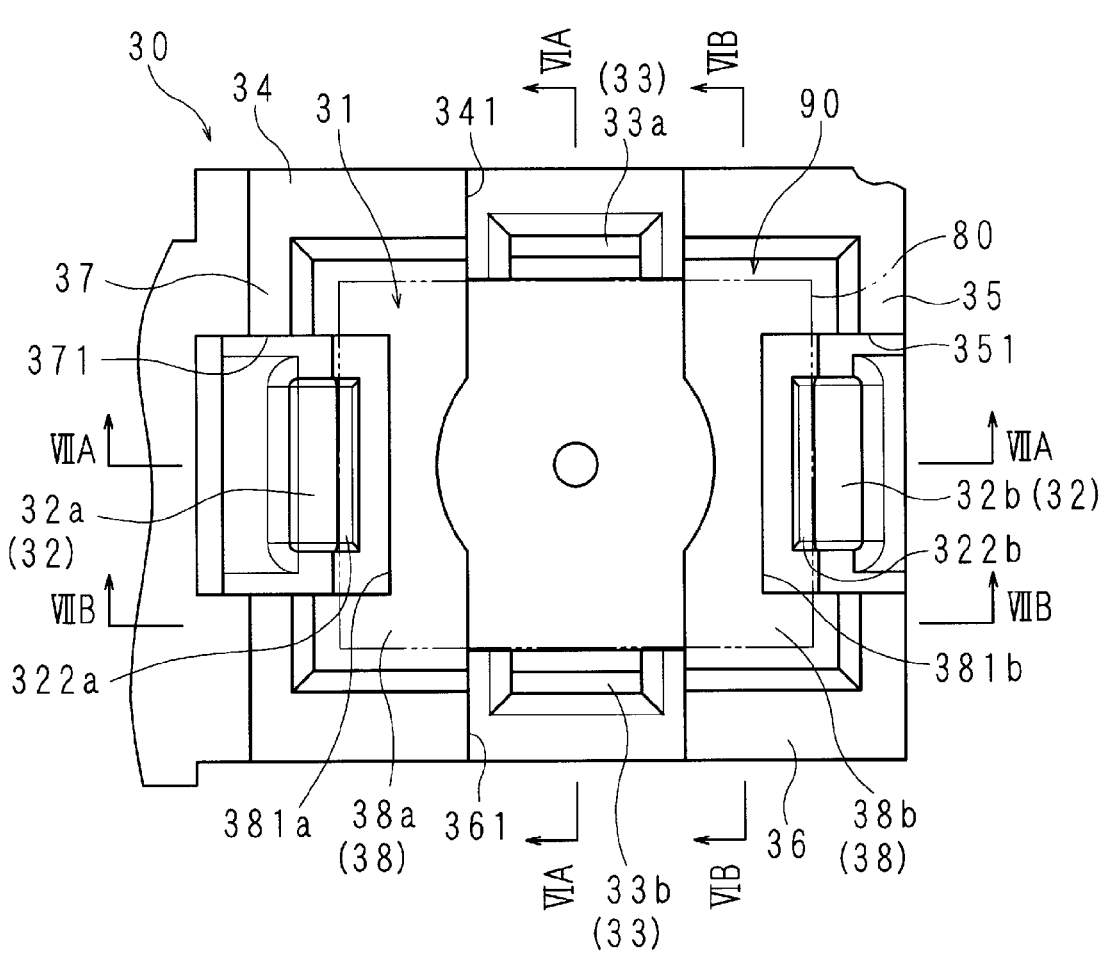
FIG. 5 is an enlarged view showing a mount of the electrical junction box according to the present embodiment and the vicinity of the mount.
Figure 6A:
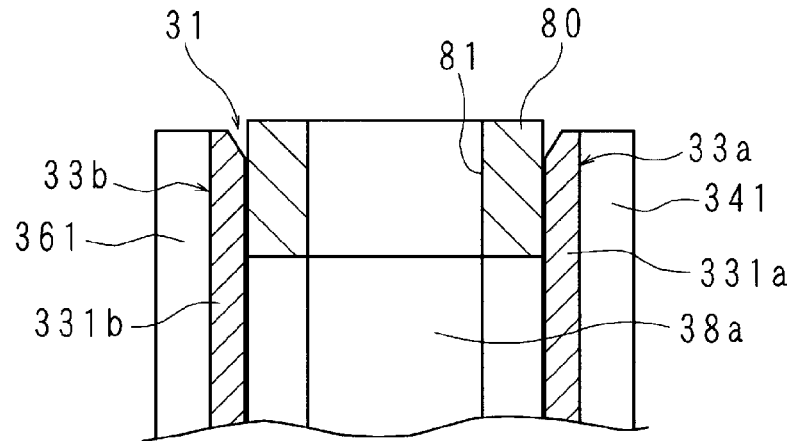
FIG. 6A shows a cross-sectional view of FIG. 5 taken along line VIA-VIA.
Figure 6B:
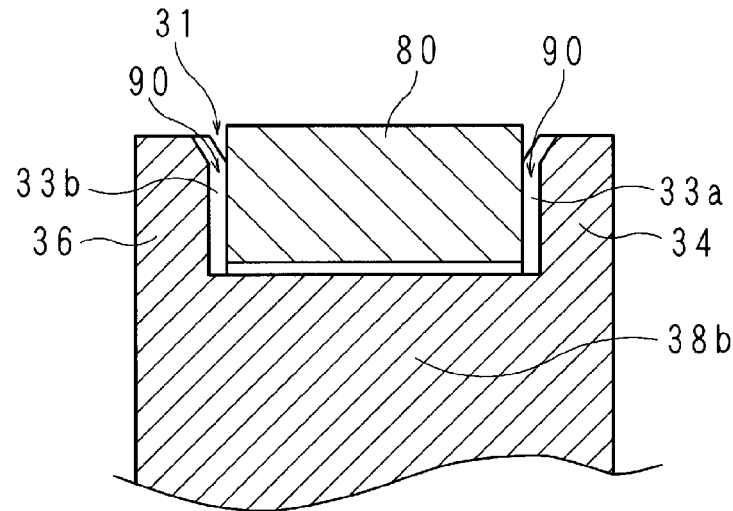
FIG. 6B a shows a cross-sectional view of FIG. 5 taken along line VIB-VIB.
Figure 7A:
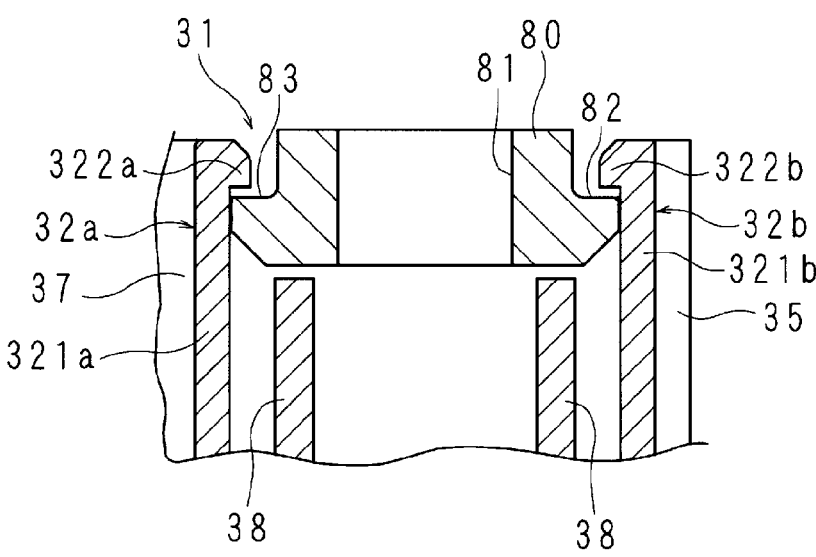
FIG. 7A shows a cross-sectional view of FIG. 5 taken along line VIIA-VIIA.
Figure 7B:
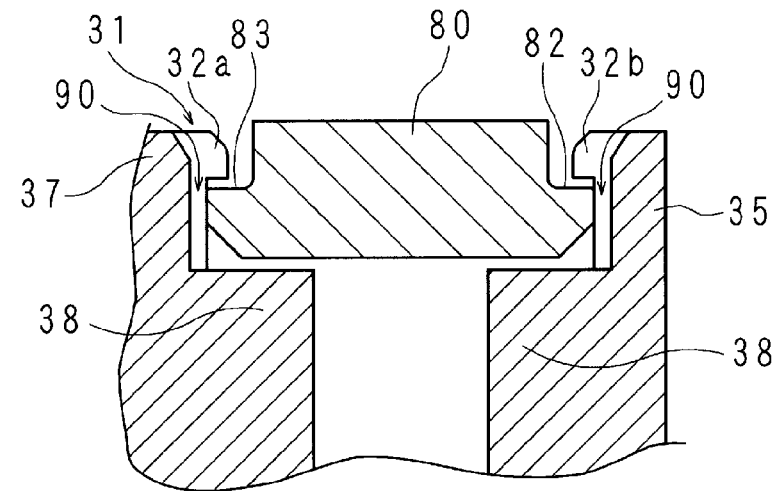

FIG. 5 is an enlarged view of the mount 30 and the vicinity of the mount 30 of the electrical junction box 100, FIG. 6A and FIG. 6B show cross-sectional views taken along line VIA-VIA and line VIB-VIB of FIG. 5, and FIG. 7A and FIG. 7B show cross-sectional views taken along line VIIA-VIIA and line VIIB-VIIB of FIG. 5. FIG. 5 shows the nut 80 with a double chain line for convenience.

The mount 30 (fixing mechanism) includes a housing recess 31 having the shape of an enclosure with one side thereof open and the nut 80 housed in the housing recess 31. The nut 80 is rectangular, and the housing recess 31 is also rectangular as seen from the bottom.

The nut 80 is made of a conductive metal plate and has a threaded hole 81 (through-hole) formed at the center thereof. The nut 80 is housed in the housing recess 31 with one main surface thereof exposed. Formed on the above-described main surface of the nut 80 are engaging portions 82 and 83 that engage protrusions 322a and 322b, respectively, of pinchers 32a and 32b to be described below (see FIG. 7). The engaging portions 82 and 83 are formed by cutting out edge portions of two opposing sides of the four sides of the nut 80 in a rectangular shape. Moreover, the locations of the other main surface of the nut 80 that correspond to the engaging portions 82 and 83 are chamfered.

The housing recess 31 is composed of four sidewalls 34, 35, 36, and 37. The four sidewalls 34, 35, 36, and 37 stand erect on the bottom of the upper case 51, with the sidewalls 34 and 36 opposing each other and the sidewalls 35 and 37 opposing each other. The sidewall 34 and the sidewall 36 oppose both respective long sides of the nut 80, and the sidewall 35 and sidewall 37 oppose both respective short sides of the nut 80. The dimension between the sidewall 35 and the sidewall 37 is greater than the length of the nut 80, and the dimension between the sidewall 34 and the sidewall 36 is greater than the width of the nut 80. In other words, when the nut 80 is housed in the housing recess 31, the dimension of the housing recess 31 in the radial direction of the threaded hole 81 is greater than the nut 80.

In addition, the mount 30 has two pairs of pinchers that pinch the nut 80. The two pairs of pinchers include a first pair of pinchers 32 consisting of two pinchers 32a and 32b, and a second pair of pinchers 33 consisting of two pinchers 33a and 33b. The pinchers 32a and 32b oppose each other, and the pinchers 33a and 33b also oppose each other. The direction in which the pinchers 32a and 32b oppose each other is orthogonal to the direction in which the pinchers 33a and 33b oppose each other. The first pair of pinchers 32 and the second pair of pinchers 33 are provided inside the housing recess 31, with the first pair of pinchers 32 pinching the nut 80 on the short sides and the second pair of pinchers 33 pinching the nut 80 on the long sides. The first pair of pinchers 32 and the second pair of pinchers 33 have different shapes from each other.

The pinchers 32a and 32b of the first pair of pinchers 32 are provided adjacent to the sidewall 35 and the sidewall 37, respectively.

A rectangular cutout 351 is formed in the center of the sidewall 35 to extend in the height direction of the sidewall 35, and the pincher 32b is provided in the cutout 351. The pincher 32b is provided to protrude further inward of the housing recess 31 than the inner surface of the sidewall 35.

A rectangular cutout 371 is formed in the center of the sidewall 37 to extend in the height direction of the sidewall 37, and the pincher 32a is provided in the cutout 371. The pincher 32a is provided to protrude further inward of the housing recess 31 than the inner surface of the sidewall 37.

The pinchers 33a and 33b of the second pair of pinchers 33 are provided adjacent to the sidewall 34 and the sidewall 36, respectively.

A rectangular cutout 341 is formed in the center of the sidewall 34 to extend in the height direction of the sidewall 34, and the pincher 33a is provided in the cutout 341. The pincher 33a is provided to protrude further inward of the housing recess 31 than the inner surface of the sidewall 34.

A rectangular cutout 361 is formed in the center of the sidewall 36 to extend in the height direction of the sidewall 36, and the pincher 33b is provided in the cutout 361. The pincher 33b is provided to protrude further inward of the housing recess 31 than the inner surface of the sidewall 36.

The sidewall 34 is divided in half by the cutout 341, and the sidewall 36 is divided in half by the cutout 361.

Two block-shaped support bases 38 are provided at the bottom of the housing recess 31 to support the other main surface of the nut 80. Of the two support bases 38, the support base 38a is provided on the pincher 32a side, and support base 38b is provided on the pincher 32b side. The support base 38a and the support base 38b are separated by the width of the cutout 341 or the cutout 361.

That is, the support base 38a extends from a portion of the halved sidewall 34 to a portion of the halved sidewall 36. Furthermore, the support base 38b extends from the other portion of the halved sidewall 34 to the other portion of the halved sidewall 36.

The center portion of the surface of the support base 38a opposing the support base 38b is cut out in an arcuate shape as seen from the bottom in order to allow a column portion of the screw 60 to pass therethrough. Moreover, also has a rectangular cutout 381a as seen from the bottom is formed in the opposite surface of the support base 38a to the above-described opposing surface. That is, the support base 38a is formed in a C-shape open on the pincher 32a side as seen from the bottom. A predetermined interval is formed between the pincher 32a and the support base 38a.

The center portion of the surface of the support base 38b opposing the support base 38a is also cut out in an arcuate shape as seen from the bottom. A rectangular cutout 381b as seen from the bottom is formed in the opposite surface of the support base 38b to the above-described opposing surface. The support base 38b is formed in a C-shape open on the pincher 32b side as seen from the bottom. A predetermined interval is formed between the pincher 32b and the support base 38b.

The pincher 33a of the second pair of pinchers 33 has a rectangular elastic deformation portion 331a that protrudes from the bottom of the upper case 51. The elastic deformation portion 331a is made of resin and extends in the thickness direction of the nut 80, that is, in the height direction of the sidewall 34 (see FIG. 6). The width of the elastic deformation portion 331a is smaller than that of the cutout 341 of the sidewall 34, and the height of the elastic deformation portion 331a is approximately the same as that of the sidewall 34. The inner edge of the distal end portion of the elastic deformation portion 331a is chamfered.

The pincher 33b also has an elastic deformation portion 331b corresponding to the elastic deformation portion 331a of the pincher 33a. Since the pinchers 33a and 33b have the same shape as each other, description of the pincher 33b is omitted.

When the nut 80 is housed in the housing recess 31, the second pair of pinchers 33 pinch both long sides of the nut 80 as described above. The elastic deformation portion 331a of the pincher 33a comes into elastic contact with one side face of the nut 80, and the elastic deformation portion 331b of the pincher 33b comes into elastic contact with the other side face of the nut 80.

The elastic deformation portion 331a and the elastic deformation portion 331b are deformable in the thickness direction thereof, that is, in the opposing direction thereof.

As described above, the pincher 33a is provided in the cutout 341 of the sidewall 34 and further inward of the housing recess 31 than the sidewall 34. Therefore, the pincher 33a is bendable outward of the housing recess 31 via the cutout 341. Additionally the space between the pincher 33a and the pincher 33b is open, and the pincher 33a is also bendable inward of the housing recess 31.

Moreover, the pincher 33b is provided in the cutout 361 of the sidewall 36 and further inward of the housing recess 31 than the sidewall 36. Therefore, the pincher 33b is bendable outward of the housing recess 31 via the cutout 361. Additionally the space between the pincher 33a and the pincher 33b is open, and the pincher 33b is also bendable inward of the housing recess 31.

Therefore, while pinching the nut 80, the pinchers 33a and 33b are deformable in the opposing direction of the pinchers 33a and 33b.

The pincher 32a of the first pair of pinchers 32 has a rectangular elastic deformation portion 321a that protrudes from the bottom of the upper case 51. The elastic deformation portion 321a is made of resin and extends in the thickness direction of the nut 80, that is, in the height direction of the sidewall 37 (see FIG. 7). The width of the elastic deformation portion 321a is smaller than that of the cutout 371 of the sidewall 37, and the height of the elastic deformation portion 321a is approximately the same as that of the sidewall 37.

Furthermore, a protrusion 322a is provided to protrude from the distal end of the elastic deformation portion 321a toward the nut 80, that is, toward the center of the housing recess 31. The protrusion 322a extends in a direction orthogonal to the elastic deformation portion 321a. In other words, the distal end portion of the pincher 32a is bent in a hook shape.

The pincher 32b also has an elastic deformation portion 321b and the protrusion 322b corresponding to the elastic deformation portion 321a and the protrusion 322a of the pincher 32a. Since the pinchers 32a and 32b have the same shape as each other, description of the pincher 32b is omitted.

When the nut 80 is housed in the housing recess 31, the first pair of pinchers 32 pinch both short sides of the nut 80 as described above. The elastic deformation portion 321a of the pincher 32a comes into elastic contact with one side face of the nut 80, and the elastic deformation portion 321b of the pincher 32b comes into elastic contact with the other side face of the nut 80. When this occurs, the protrusion 322a of the pincher 32a engages the engaging portion 83 of the nut 80, and the protrusion 322b of the pincher 32b engages the engaging portion 82 of the nut 80 (see FIG. 7).

The elastic deformation portion 321a and the elastic deformation portion 321b are deformable in the thickness direction thereof, that is, deformable in the opposing direction thereof.

As described above, the pincher 32a is provided in the cutout 371 of the sidewall 37 and further inward of the housing recess 31 than the sidewall 37. Therefore, the pincher 32a is bendable outward of the housing recess 31 via the cutout 371. Moreover, the support base 38a also has a cutout 381a on the pincher 32a side. Because a predetermined interval is formed between the pincher 32a and the support base 38a, the pincher 32a is also bendable inward of the housing recess 31.

Moreover, the pincher 32b is provided in the cutout 351 of the sidewall 35 and further inward of the housing recess 31 than the sidewall 35. Therefore, the pincher 32b is bendable outward of the housing recess 31 via the cutout 351. Moreover, the support base 38b also has a cutout 381b on the pincher 32b side. Because a predetermined interval is formed between the pincher 32b and the support base 38b, the pincher 32b is also bendable inward of the housing recess 31.

Therefore, while pinching the nut 80, the pinchers 32a and 32b are deformable in the opposing direction of the pinchers 32a and 32b.

Meanwhile, due to design errors or tolerances, the distance between the fixing legs 11 may deviate significantly from expected values in the fuse unit 10, or the longitudinal dimensions of the fixing legs 11 may deviate significantly from expected values. In this case, a large misalignment also occurs between the above-described screw through-hole of each fixing leg 11 and the threaded hole 81 of the nut 80, making proper screw-fastening with screws 60 impossible. Moreover, if the screws 60 are screwed into the threaded holes 81 by force, the fixing legs 11 may deform under the load on the fixing legs 11 or the fuse unit 10 may be damaged.

In contrast, according to the electrical junction box 100 of the present embodiment, the mount 30 (fixing mechanism) can provide a solution to this problem. The following provides a detailed description.

As described above, while pinching the nut 80, the pinchers 33a and 33b are deformable in the direction in which the pinchers 33a and 33b oppose each other, and the pinchers 32a and 32b are deformable in the direction in which the pinchers 32a and 32b oppose each other. Additionally the dimension of the housing recess 31 in the radial direction of the threaded hole 81 is greater than the nut 80. Accordingly when housed in the housing recess 31, the nut 80 is capable of changing position inside the housing recess 31 while being pinched by the first pair of pinchers 32 and the second pair of pinchers 33.

Therefore, even if a large misalignment occurs between the above-described screw through-hole of each fixing leg 11 and the threaded hole 81 of the nut 80, the threaded hole 81 of the nut 80 can be moved into alignment with the above-described screw through-hole of each fixing leg 11, allowing for proper screw-fastening with the screws 60.

Furthermore, in the electrical junction box 100 according to the present embodiment, when the nut 80 is housed in the housing recess 31, the engaging portions 82 and 83 of the nut 80 engage the protrusions 322a and 322b of the first pair of pinchers 32 (pinchers 32a and 32b), thereby preventing the nut 80 from coming out of the housing recess 31.

The mount 40 has the recess 42 having a rectangular shape as seen from the bottom in which the nut 80 is housed (see FIGS. 3 and 4). The recess 42 is formed from sidewalls including the sidewall 41, and a support base 43 that supports the nut 80 is provided in the recess 42. The support base 43 has the shape of a rectangular column fitted in the recess 42. Moreover, a retention member 44 that retains the nut 80 is provided on the sidewall of the recess 42 that opposes the sidewall 41. Since the shape of the retention member 44 is the same as the pinchers 32a and 32b of the mount 30, detailed description thereof is omitted.

In the present embodiment, while an exemplary case has been described in which the mount 40 has a different configuration from the mount 30, the disclosure is not limited thereto, and the configuration of the mount 40 may be the same as that of the mount 30.

Additionally, in the present embodiment, the case where the second pair of pinchers 33 has a different configuration from the first pair of pinchers 32 is described above as an example, but the disclosure is not limited thereto, and the shape of the second pair of pinchers 33 may be the same as that of the first pair of pinchers 32.

Additionally in the present embodiment, the case where the engaging portions 82 and 83 are formed only on the short sides of the nut 80 is described above as an example, but the disclosure is not limited thereto, and the engaging portions 82 and 83 may also be formed on the long sides of the nut 80.

Furthermore, the case where the rotation prevention bar 70 is provided on the outside of a long-side sidewall 21 of the recess 20 is described as an example, but the present disclosure is not limited thereto. The rotation prevention bar 70 may be provided on the outside of the short-side sidewall 23 and 24.

The embodiments disclosed herein should be considered to be illustrative in all respects and not restrictive. The scope of the present disclosure is indicated by the claims rather than by the above meaning, and all changes that come within the meaning and range of equivalency of the claims are intended to be encompassed therein.

The invention claimed is:

1. A fixing mechanism receiving a nut, wherein the nut is rectangular and includes a long side and a short side, comprising:

a first pair of pinchers and a second pair of pinchers, both configured to pinch the nut, wherein each of the first pair of pinchers and the second pair of pinchers are disposed to oppose each other and are deformable in an opposing direction thereof, and wherein each of the first pair of pinchers includes a protrusion disposed at a distal end that protrudes towards the nut, and each of the second pair of pinchers having a thickness that is uniform and extends substantially along a height of the pair of second pinchers that are uniform to each other, and wherein the first pair of pinchers are configured to pinch the nut along the short side and the second pair of pinchers are configured to pinch the nut along the long side.

2. The fixing mechanism according to claim 1, further including:

a housing recess configured to housing the nut, wherein a dimension of the housing recess in a radial direction of a through-hole of the nut is greater than the nut, and at least one of the first pair of pinchers and the second pair of pinchers is provided further inward than an inner surface of the housing recess.

3. The fixing mechanism according to claim 2, comprising:

wherein each pincher includes an elastic deformation portion that extends in a thickness direction of the nut.

4. The fixing mechanism according to claim 3, wherein the nut is housed in the housing recess with one surface thereof exposed, and an engaging portion of the nut is configured to engage the protrusions is formed on the one surface.

5. The fixing mechanism according to claim 4, wherein a cutout is formed in a sidewall of the housing recess at a location that corresponds to each pincher.

6. The fixing mechanism according to claim 2, wherein a cutout is formed in a sidewall of the housing recess at a location that corresponds to each pincher.

7. The fixing mechanism according to claim 3, wherein a cutout is formed in a sidewall of the housing recess at a location that corresponds to each pincher.

8. An electrical junction box comprising:

an enclosure;

the fixing mechanism according to claim 1; and an electronic component fixed to the enclosure by the fixing mechanism.

9. The electrical junction box as set forth in claim 1, wherein the fixing mechanism includes a housing recess configured to housing the nut, wherein a dimension of the housing recess in a radial direction of a through-hole of the nut is greater than the nut, and at least one of the first pair of pinchers and the second pair of pinchers is provided further inward than an inner surface of the housing recess.

10. The electrical junction box as set forth in claim 9, wherein the opposing direction of the first pair of pinchers intersects with the opposing direction of the second pair of pinchers, wherein a dimension of the housing recess in a radial direction of a through-hole of the nut is greater than the nut, and at least one of the first pair of pinchers and the second pair of pinchers is provided further inward than an inner surface of the housing recess.

11. The electrical junction box as set forth in claim 10, wherein the nut is housed in the housing recess with one surface thereof exposed, and an engaging portion of the nut is configured to engage the protrusions is formed on the one surface.

12. The electrical junction box as set forth in claim 9, wherein a cutout is formed in a sidewall of the housing recess at a location that corresponds to each pincher.

\* \* \* \* \*